United States Patent [19]

Progler

[11] Patent Number: 5,072,126
[45] Date of Patent: Dec. 10, 1991

[54] PROMIXITY ALIGNMENT USING POLARIZED ILLUMINATION AND DOUBLE CONJUGATE PROJECTION LENS

[75] Inventor: Christopher J. Progler, Hopewell Junction, N.Y.

[73] Assignee: International Business Machines Corporation, Armonk, N.Y.

[21] Appl. No.: 606,260

[22] Filed: Oct. 31, 1990

[51] Int. Cl.$^5$ .............................................. G01N 21/86
[52] U.S. Cl. .................................... 250/548; 250/225
[58] Field of Search ...................... 250/548, 358, 225; 356/399, 400, 401

[56] References Cited

U.S. PATENT DOCUMENTS 4,701,606  10/1987  Tanimoto et al. ................... 250/225
4,937,459   6/1990  Ina ........................................ 250/225

Primary Examiner—David C. Nelms
Assistant Examiner—Khaled Shami
Attorney, Agent, or Firm—Graham S. Jones, II

[57] ABSTRACT

Alignment of two objects such as a mask and a wafer is achieved using crossed polarizer imaging and polarization sensitive targets to enhance signal contrast in proximity alignment. Two linearly polarized illumination beams with electric field polarization axes at oblique angles to each other illuminate and interact with mask and wafer marks. The marks are oriented to induce a partial depolarization of each incident illumination at each plane, i.e. the marks make some of the light visible upon passing through filters and a polarization analyzer. When marks are viewed through a polarization analyzer stray light is rejected and mark contrast greatly improved.

6 Claims, 6 Drawing Sheets

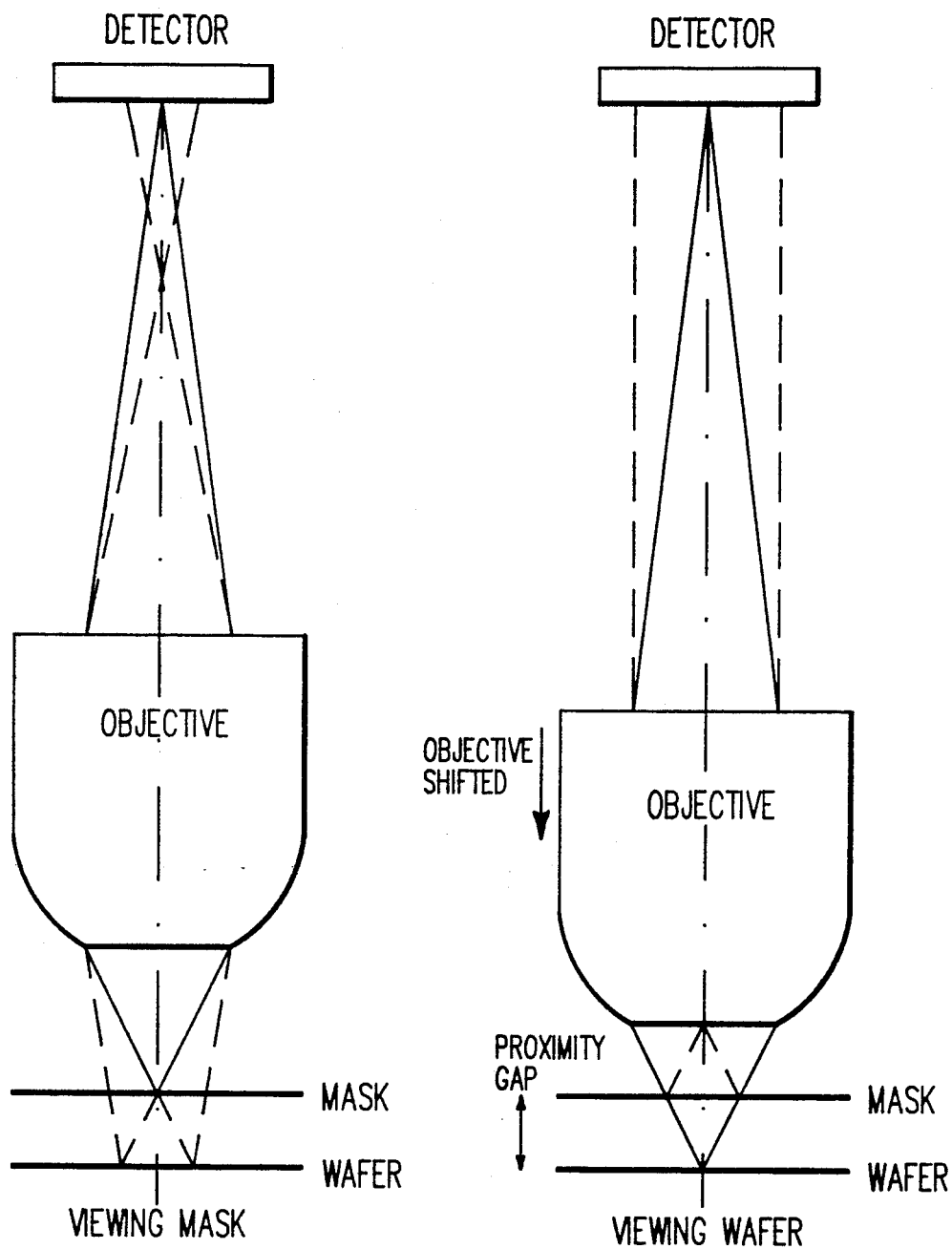

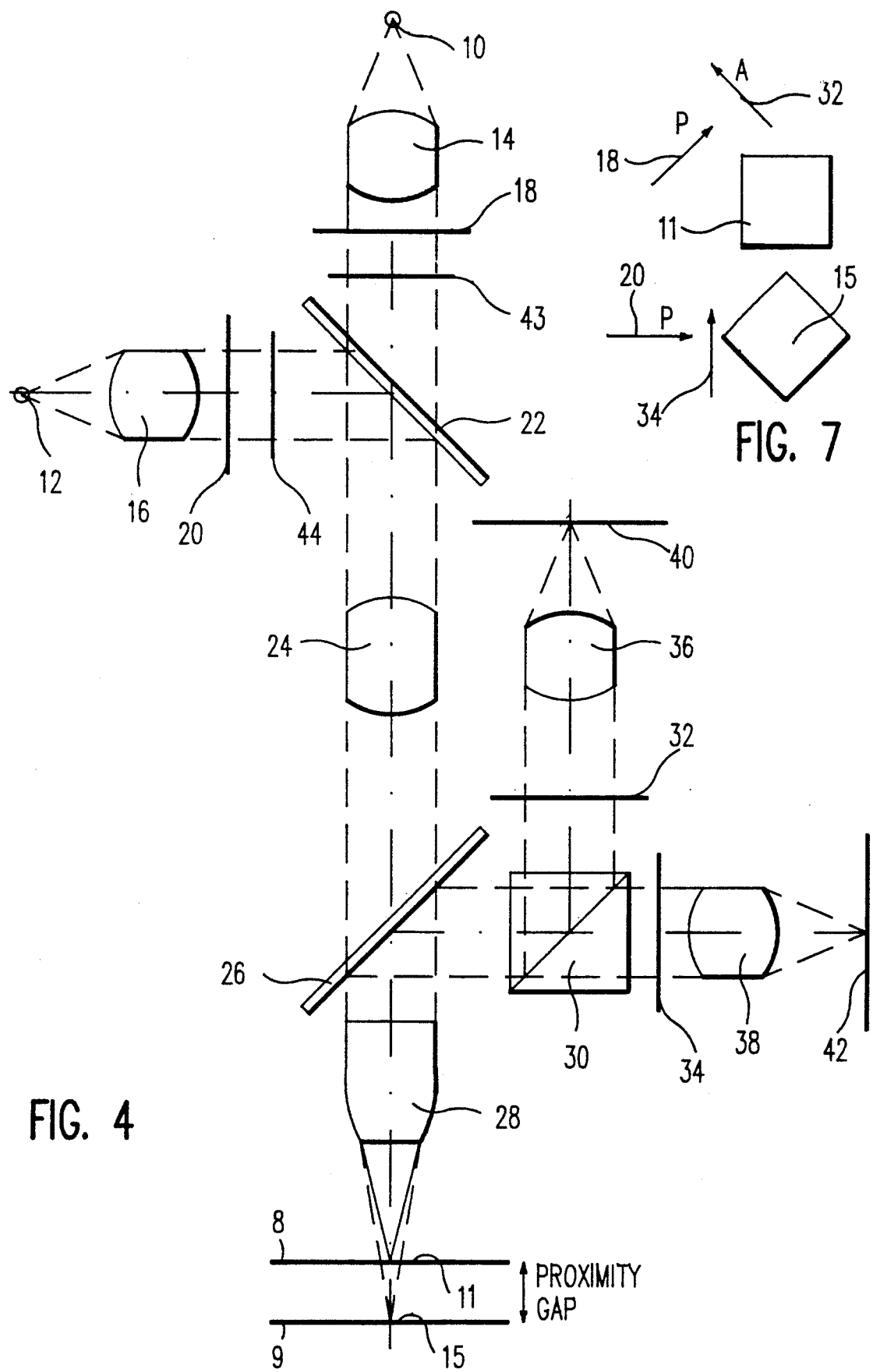

MASK CONJUGATE

WAFER CONJUGATE

PROMIXITY ALIGNMENT USING POLARIZED ILLUMINATION AND DOUBLE CONJUGATE PROJECTION LENS

BACKGROUND OF THE INVENTION

1. Field of the Invention

The present invention relates to alignment between two objects, more particularly to wafer/mask alignment in lithographic systems and even more particularly to alignment of lithographic elements in semiconductor manufacturing systems.

2. Description of Related Art

In order to use a wafer stepper to expose images with an x-ray source, the mask and the wafer must be held within close proximity to each other, e. g. 40 micrometers or less apart. Therefore, wafer stepper site by site alignment of circuit levels is performed with no more than a limited distance between the mask plane and the wafer plane. This constraint forces standard, dual focus alignment schemes to receive signals from the two planes, simultaneously.

In one embodiment of such prior alignment systems, the alignment objective lens views the wafer marks through the mask and then refocusses to view the mask marks. Note that the wafer is located in the background as illustrated by FIGS. 1A and 1B. Each of FIGS. 1A and 1B shows a wafer with a mask above it, an objective lens piece above it, plus a CCD for sensing the radiation from the mask and wafer through the objective lens. In each drawing, the solid lines represent the light which is in focus and the dotted lines represent the light which is from the background. FIG. 1A shows the objective lens focussed for viewing an alignment mark on the mask. The solid lines represent the mask mark image. The dotted lines represent the wafer background. In FIG. 1B, which shows the objective lens focussed for viewing the wafer, the solid line represents the wafer mark image and the dotted lines represent the background from the mask. Although the space (proximity gap) between the mask and the wafer is great enough to cause blurring of the defocussed image, the background is very strongly visible and can lead to offsets and to a reduced contrast ratio in the captured (detected) alignment mark image. The background can take the form of reflected or diffracted optical stray light.

In short the general problem to be overcome includes the alteration and/or corruption of the wafer alignment target or mask alignment target in a proximity alignment system caused by optical stray light from a background object in close vertical proximity to the viewing object.

U.S. Pat. No. 4,577,968, commonly assigned, of Makosch for "Method and Arrangement for Optical Distance Measurement" describes a method for determining distances optically where the phase shift of two perpendicularly polarized light beams upon diffraction from an optical grating is determined by directing those beams at an optical grating associated with an object whose displacement is to be measured to cause a phase shift between the two light beams. The light beams, of equal order, are combined after the diffraction from the optical grating. The phase shift caused by the diffraction from the grating is used as a measure of the displacement of the object. Alignment between two objects can be determined in a similar way. If there is perfect alignment of the gratings on the two objects, then there will be no phase difference between the diffracted light from the two objects' gratings. If there is a misalignment, then a signal is generated indicating the degree of misalignment.

In U.S. Pat. No. 4,779,001 of Makosch for "Interferometric Mask-Wafer Alignment" the patent states as follows: "An optical transmission grating is provided in the mask and illuminated by a collimated light beam, e.g. a laser. Two symmetrical diffraction orders, e.g. the $+/-1$ orders, are then focussed by the imaging system in one common spot on the optical grating that is provided on the wafer and has the same grating constant as the image of the mask grating. The two incident diffraction orders are diffracted a second time at the wafer grating to return along the optical axes and to be deflected by a semi-transparent mirror to a photo detector whose output signal is evaluated for the relative phase difference of the two diffracted beams. For that purpose the phase of the two beams that are diffracted at the mask is changed periodically in three steps, e.g., by a thin oscillating glass plate arranged in series with the mask grating."

To separate X, Y alignment information a lambda/2 film is introduced to beamsplitter 5 in FIG. 2A of Makosch over regions 5a in FIG. 2B. This rotates the polarization of one axis by 90°. X, Y signals are then separated at the detector assembly 6a, 6b, 6c in FIG. 2A due to the orthogonal polarizations of X, Y information.

The current invention differs from this in that the 2-D broadband extended image is formed at the mask and wafer detectors. The polarization rejection eliminates stray optical light and permits mask data to be separated from wafer data, but has no part in decoupling X alignment data from Y alignment data as in Makosch '001.

Advantages of the current invention include process insensitivity due to broadband imaging, proximity plane stray light rejection, no moving optical components during alignment, simultaneous imaging of the mask and wafer planes and flexibility in mark design.

Makosch '001 uses a pair of gratings on a mask and a wafer and a laser alignment beam. FIG. 2A of Makosch '001 shows a laser beam reflected from a dichroic deflection mirror. The reflected laser beam passes down through an x, y alignment grating on a mask which splits the beam into diffracted orders which traverse a tiltable glass plate and a beam splitter plate to be focussed by linear magnification by an optical system. The tilted glass plate is oriented at 45° with respect to the planes defined by the two pairs of diffracted beams, so that mutual phase differences in the beam pairs are introduced by tilting the glass plate. In the center of the beam splitter, a dichroic mirror totally reflects the partial beams from the wafer mask. The light from the dichroic mirror passes through a polarizing beam splitter to the x and y photo detectors for detection thereby.

SUMMARY OF THE INVENTION

In accordance with this invention, apparatus for aligning a first object and a second object in conjugate planes of an imaging system, the first object having a first depolarizing alignment mark, the second object having a second depolarizing alignment mark, comprising a) a first object with a first alignment mark and a second object with a second alignment mark, the objects being in conjugate planes, with the first alignment mark positioned at an oblique angle of rotation with respect to the second alignment mark, b) light beam means for illuminating the first and second alignment marks including a pair of polarized light beams directed along a common optical path towards the first and second alignment marks with the first and second light beams being polarized at an oblique angle angle with respect to each other, one of the light beams adapted for interacting with a depolarizing alignment mark on the first object and the other of the light beams being adapted for interacting with a depolarizing alignment mark on second object, c) depolarizing alignment marks on the first and second objects aligned to interact with the light beams by being at an angle of rotation appropriate for depolarizing the corresponding one of the light beams, d) means for receiving any reflections of the light beams from the first and second alignment marks the reflections being directed along a common optical path and being separated optically by beam splitting into first and second output beams passed through polarization analyzing filters to produce polarized output beams, and e) means for measuring the the light from each of the polarized output beams.

Preferably the oblique angles are about 45°; and the shutters are provided for blocking light from each of the first and second light beams selectively.

A method of aligning a first object and a second object in conjugate planes of an imaging system, the first object having first alignment mark, the second object having a second alignment mark, comprising a) illuminating the first and second alignment marks with a pair of polarized light beams directed along a common optical path towards the first and second selectively depolarizing alignment marks, with the polarization direction of the first and second light beams being oriented at different angles and the first and second alignment marks being oriented at different angles for selectively depolarizing corresponding ones of the first and second beams, b) the reflections of the light beams from the first and second alignment marks being directed along a common optical path and being separated optically by means for beam splitting into first and second output beams passed through polarization filters to produce polarized output beams, c) measuring the the light from each of the polarized output beams.

It is preferred that the different angles are about 45° apart It is further preferred to shutter for blocking light from each of the first and second light beams selectively.

Further aspects of the invention are described in the drawing and the description which follows.

BRIEF DESCRIPTION OF THE DRAWINGS

FIGS. 1A and B show a prior art alignment system in which the alignment objective lens view the wafer marks through the mask marks with the wafer located in the background.

FIG. 2A shows "Pattern I" and FIG. 2B shows "Pattern II".

FIG. 3B is the same alignment fiducial viewed through crossed polarizers. The alignment structure of mask and wafer mark orientation in accordance with this invention is illustrated by FIGS. 3A and 3B.

FIG. 4 is a schematic diagram of an alignment system employing a double conjugate lens in an embodiment in accordance with this invention.

FIG. 7 shows a schematic diagram of the orientations of the alignment marks on the mask and the wafer and the orientations of the polarizing filter and the analyzer filter for both the mask and the wafer of FIG. 4.

The foregoing and other objects, features and advantages of the invention will be apparent from the more particular description of the preferred embodiment of the invention which follows.

DESCRIPTION OF THE PREFERRED EMBODIMENT

Disclosure of the Invention

This invention involves the use of crossed polarizer imaging and polarization sensitive targets to enhance signal contrast in proximity alignment.

In a preferred embodiment, the invention uses a double conjugate lens to image the two proximity planes simultaneously.

In principle, in a crossed polarizer, an unpolarized light source is linearly polarized by a standard apparatus such as a dichroic sheet. The radiation passing through the dichroic sheet illuminates the object being observed and the scattered, reflected, or transmitted light is passed through another linear polarizer rotated 90° relative to the first (crossed) linear polarizer. Any structure, preceding (see discussion of FIG. 6 below regarding structures preceding the wafer mark), in, or on the illuminated object which causes a change or rotation in the incident polarization state will show up as bright, while structures which preserve the polarization state will be dark.

Figure 2A:
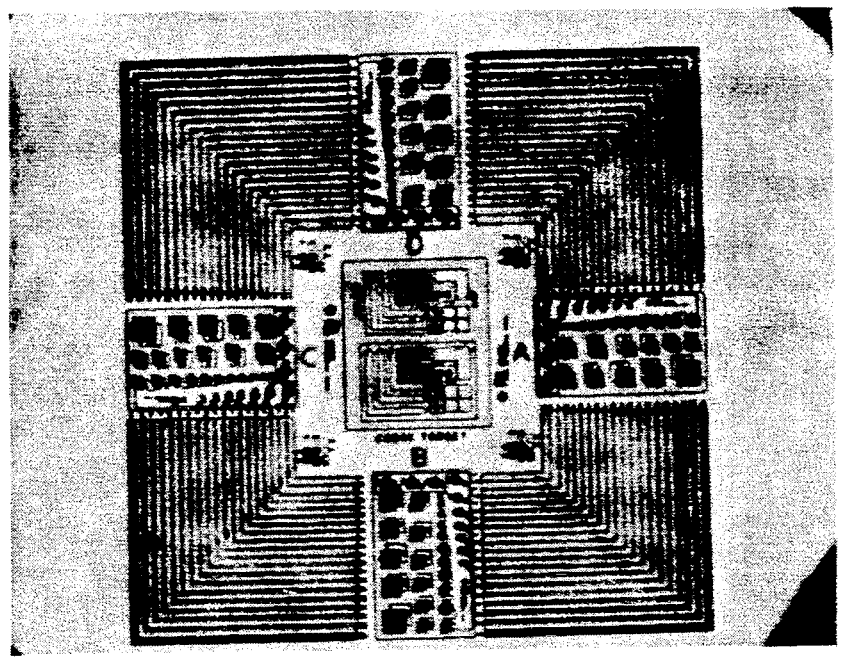
FIGS. 2A-D illustrate the errect or cross polarization when viewing selected parts of an alignment fiducial printed from a standard resolution target. The difference between two rotated orientations of the target is illustrated.
Figure 2B:
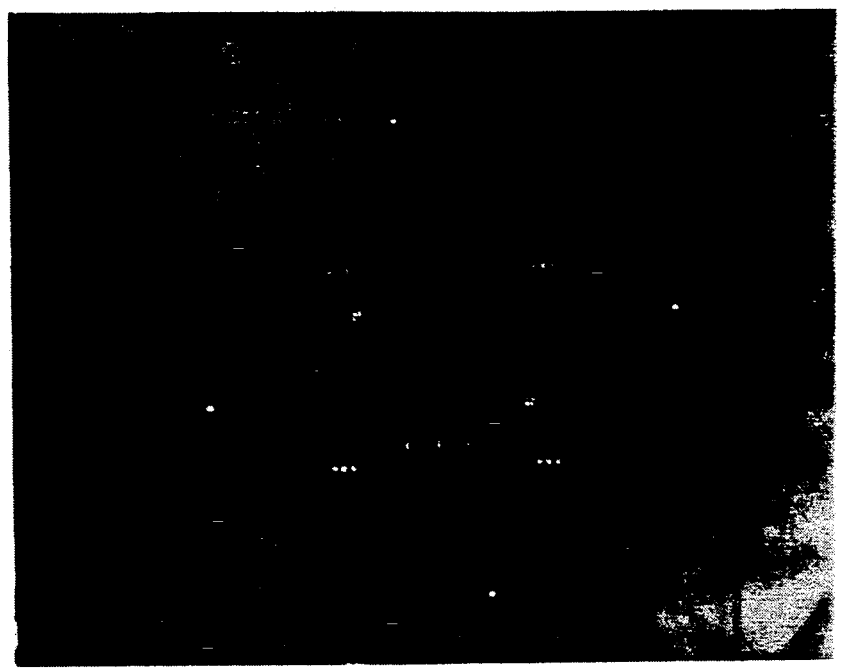

If one were to view a standard lithography pattern in crossed polarized mode, the output would be predominately black. That indicates that the object did not effectively depolarize the reflected light, and the radiation was absorbed by the crossed polarizer. However, in the special case of a phase and amplitude structure oriented with its normal 45° to the incident electric (e) field polarization direction, some fraction of the incident light will be transferred into a different polarization angle. This structure will show up as bright against a dark background after passing through the crossed polarizer, as shown in FIG. 2D. The same structure oriented parallel or perpendicular to the polarization direction will appear black when imaged, as shown in FIG. 2B. This orientation dependent contrast difference can be made much more pronounced by including many closely spaced lines at the same angle relative to the polarization direction.

Figure 2C:
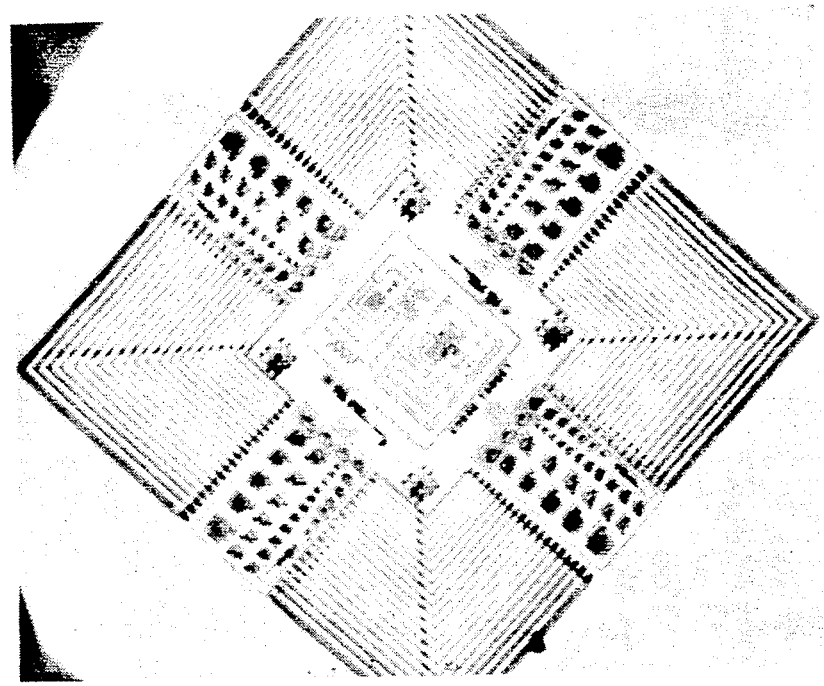
Figure 2D:
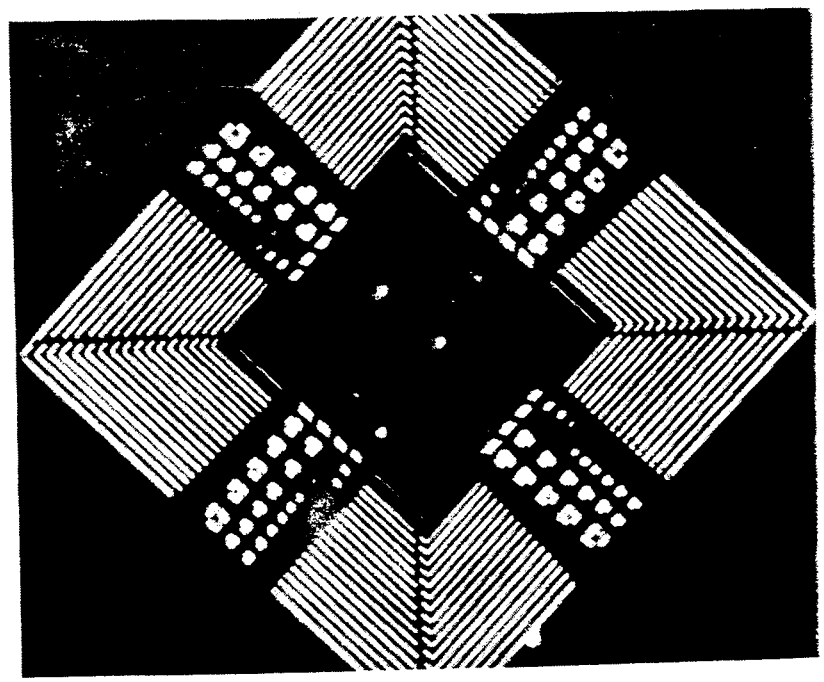

FIGS. 2A-D illustrate the effect of cross polarization when viewing selected parts of an alignment fiducial printed from a standard Kodak resolution target. The difference between two orientations of the target rotated by 45° is very substantial as shown by photographs of Pattern I (FIG.2A) as contrasted with Pattern II (FIG. 2C). A large percentage of the light is extinguished by the crossed polarizers. For FIG. 2A, the light has been extinguished in FIG. 2B because the object is oriented such that none of the incident polarization is transferred into a different polarization angle.

Therefore, all light is absorbed by cross polarizers. For FIG. 2C, only some of the image is extinguished in FIG. 2D because the 45° repetitive pattern de-polarizes the incident radiation.

Figure 3A:
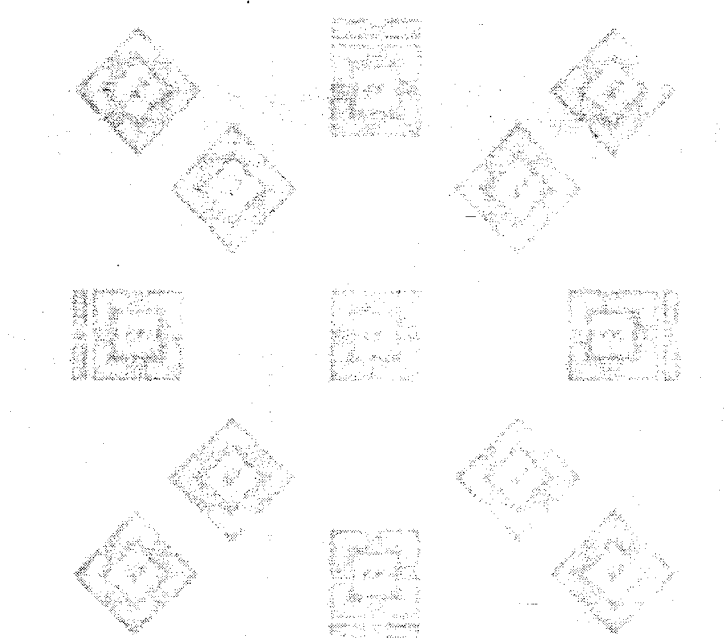
FIGS. 3A-3B show repetitive images of the alignment fiducial shown in FIGS. 2A-2D.
Figure 3B:
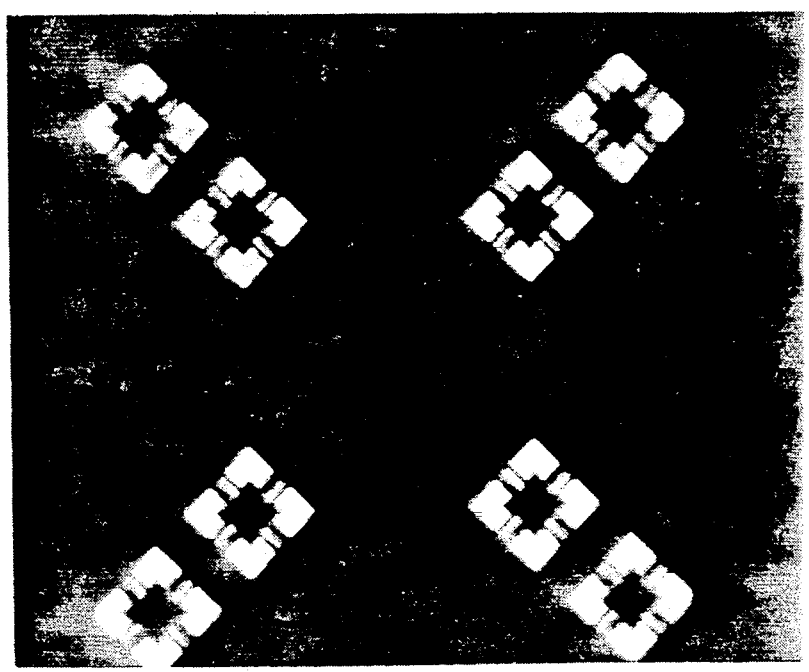

FIGS. 3A-3B shown an image of the same alignment structure shown in FIGS. 2A-D, in repetitive fashion. FIG. 3A is a bright field image. FIG. 3B is a cross polarized image of the same structure. Notice in FIG. 3B that the black area corresponds to where the "normally" (upright and horizontally aligned) box images are shown in FIG. 3A. Light from those patterns has been extinguished entirely by the crossed polarizer optics. By rotating the polarization angle 45°, the same result would have occurred on the diamond-shaped structures in FIGS. 3A and B, since the incident polarization would have been oriented normally to the diamond-shaped boxes.

Thus, referring to FIGS. 3A, 3B, and 4 if we place normally oriented patterns on the mask 8 and 45° patterns on the wafer 9 (that is at 45° to the pattern on mask 8), we can easily distinguish between the two alignment planes while also cancelling out retroreflections, etc. from the plane not involved in alignment. This has profound implications for proximity alignment schemes, especially for aligners which must perform extra signal processing to remove unwanted background noise.

Best Mode and Other Modes of Carrying Out the Invention

FIG. 4 is a diagram of a preferred embodiment of this invention which relates to aligning two objects such as mask 8 and wafer 9. An unpolarized, thermal source 10 is provided for illuminating the mark 11 on mask 8 and an unpolarized, thermal source 12 illuminates a mark 15 on a wafer 9. Source 10 generates a beam of light which passes through condenser lens 14 for the mask 8. Source 12 generates a beam which passes through condenser lens 16 for wafer 9. The light from mask source 10 passing through condenser lens 14 passes through linear mask polarizer 18 for mask 8. The light from mask source 10 passes through linear polarizer 18 which has it preferred polarization axis oriented at 45° to the mask alignment mark 11. Similarly, light from condenser lens 16 passes through linear wafer polarizer 20 for wafer 9, with polarizer 20 rotated 45° (horizontal e-field in FIG. 7) with respect to the mask polarizer 18 as illustrated in FIG. 7 and the wafer alignment mark 15, as well. The light passing through mask polarizer 18 passes through a beam splitter 22. The light from wafer polarizer 20 is reflected downwardly in parallel with the light from mask polarizer 18. The light from both the mask polarizer 18 and the wafer polarizer 20 then pass from the upper beam splitter 22 through illumination relay 24 to a second beam splitter 26. The two polarized beams interact with the mask and wafer marks each oriented at 45° to the respective polarization axes. This interaction causes a partial depolarization of each incident illumination bundle. The two partially depolarized beams reflect from the mask 8 and wafer 9 and pass back through objective 28 and are reflected by beam splitter 26 to the right to beam splitter cube 30 where the two beams are separated into two separate channels or paths. A portion of the beam passes through the beam splitter cube 30 to the right through linear polarization analyzer 34 along a first channel (first path.) Analyzer 34 is crossed at right angles relative to wafer linear polarizer 20 as shown in FIG. 7, whereby all stray light for the wafer signal is filtered out of the signal and the wafer mark is passed to conjugate correcting relay lens which relays the wafer image to the detector imaging array 42 for the wafer 9, while correcting all aberrations induced in lens 28 from the alternative conjugate use employed here to achieve an improved result. Another portion of the beam from second splitter 26 is reflected up along a different channel (travelling along a different path) by splitter cube 30 through linear polarization analyzer 32 which is crossed at right angles relative to mask linear polarizer 18 as shown in FIG. 7, whereby all mask stray light is filtered out of the signal and the reflection from mask mark is passed to relay lens 36 for projection of the mask image onto imaging array 40 for the mask 8. The orientations of the alignment marks on the wafer 9 and the mask 8 are rotated 45° relative to the incident illumination on each particular plane. Alignment is then performed by incrementally positioning the mask or wafer based on estimated mark centerlines from the detector array output. Electronic electrooptic shutters 43, 44 can be alternately opened selectively to view the mask or wafer alignment mark to further improve signal contrast. Standard electronic controls of the masking optical shutter are well known to those skilled in the art.

Figure 5:
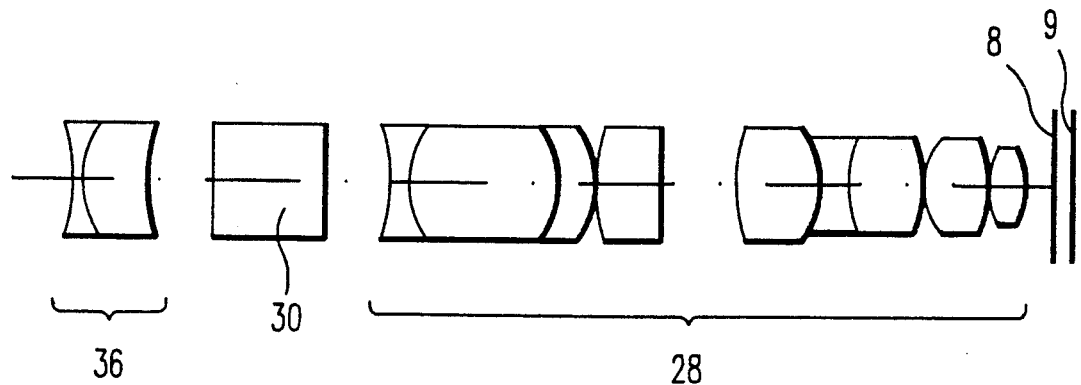
FIG. 5 shows the optical elements of one optical path of the double conjugate lens of FIG. 4.
Figure 6:
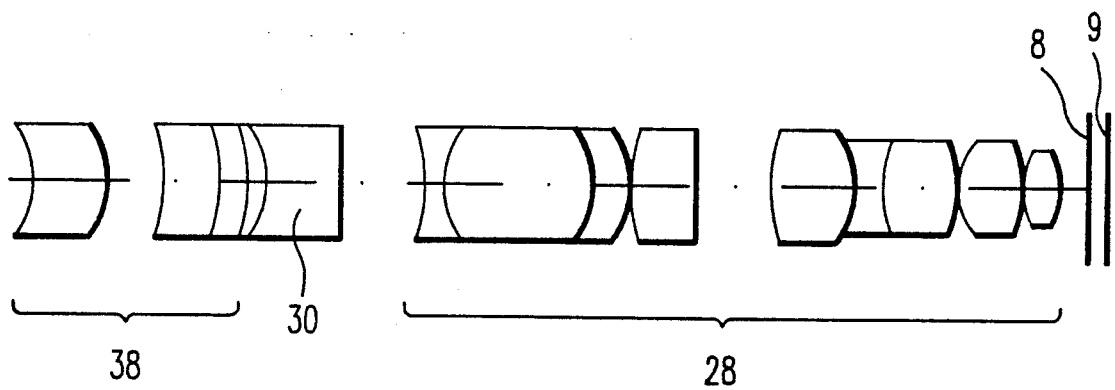
FIG. 6 shows the optical elements of the other optical path.

FIGS. 5 and 6 show the details of the structure of the double conjugate lens of FIG. 4 which is further elucidated by Tables I and II.

A first optical train in FIG. 5 includes a conjugate correcting relay lens 36, a beam splitter cube 30, and an objective 28. Objective 28 is a compound lens with many elements and interfaces. In this case the back focal distance equals 0.984 mm.

Table I shows the Separation, and Indices 1-3 for each surface of the first optical train 36, 30, 28 from left to right as seen in FIG. 5.

Referring to FIG. 6, a second optical train comprising relay lens 38, beam splitter cube 30, and objective 28 is shown and its separations and indices 1-3 are shown in Table II. In this case the back focal distance is 1.015 mm.

In summary, this invention provides illumination of an alignment fiducial with linearly polarized light and subsequent detection through a linear polarizer rotated 90° relative to the illuminated linear polarization. The alignment fiducial is oriented at 45° relative to the illuminated linear polarization angle. The simultaneous illumination and imaging of a mask and wafer held in close proximity where the mask illumination is linearly polarized and oriented at 45° to the wafer illumination polarization angle with subsequent detection of each alignment mark through a linear polarization filter oriented at 90° to the initial illumination polarization angle. The system and method provide simultaneous imaging of a mask and wafer through two partially common imaging channels, each having a polarizer. The use of structures such as optical filters, phase retarders, wave plates, or other artificial alignment mark independent means is contemplated to enhance the depolarization of light after passing through the mask alignment mark, and preceding the wafer mark to further enhance any stray light rejection.

TABLE I (FIG. 5, Mask)
EFL = 2.0000

| # | TYPE | CURVE | SEPN | 0.000589 INDEX1 | 0.000656 INDEX2 | 0.000486 INDEX3 | DISPN | CLR.RAD |
|---|---|---|---|---|---|---|---|---|
| 1 | S | −0.038475 | 0.000 | 1.000000 | 1.000000 | 1.000000 | 0.000000 | 1.30 |
| 2 | S | 0.215917 | 0.968 | 1.762000 | 1.756400 | 1.775290 | 0.018890 | 1.31 |
| 3 | S | 0.034395 | 2.352 | 1.846660 | 1.836510 | 1.872040 | 0.035530 | 1.29 |
| 4 | S | 0.000000 | 4.500 | 1.000000 | 1.000000 | 1.000000 | 0.000000 | 1.51 |
| 5 | S | 0.000000 | 6.000 | 1.516727 | 1.514322 | 1.522379 | 0.008057 | 1.71 |
| 6 | S | −0.033290 | 4.500 | 1.000000 | 1.000000 | 1.000000 | 0.000000 | 1.93 |
| 7 | S | 0.182086 | 0.750 | 1.696690 | 1.692970 | 1.705540 | 0.012570 | 2.00 |
| 8 | S | −0.151784 | 6.913 | 1.433840 | 1.432490 | 1.437040 | 0.004550 | 2.84 |
| 9 | S | −0.101923 | 1.058 | 1.613280 | 1.609240 | 1.623090 | 0.013850 | 3.05 |
| 10 | S | 0.041053 | 0.000 | 1.000000 | 1.000000 | 1.000000 | 0.000000 | 3.12 |
| 11 | S | −0.035106 | 2.917 | 1.433840 | 1.432490 | 1.437040 | 0.004550 | 3.18 |
| 12 | S | 0.085752 | 8.651 | 1.000000 | 1.000000 | 1.000000 | 0.000000 | 3.08 |
| 13 | S | −0.159994 | 4.786 | 1.433840 | 1.432490 | 1.437040 | 0.004550 | 2.74 |
| 14 | S | 0.143060 | 1.794 | 1.653970 | 1.649200 | 1.665710 | 0.016510 | 2.71 |
| 15 | S | −0.088853 | 4.314 | 1.620050 | 1.617170 | 1.626930 | 0.009760 | 2.70 |
| 16 | S | 0.174076 | 0.001 | 1.000000 | 1.000000 | 1.000000 | 0.000000 | 2.55 |
| 17 | S | 0.029637 | 2.303 | 1.497760 | 1.495520 | 1.502960 | 0.007440 | 2.07 |
| 18 | S | 0.374913 | 0.005 | 1.000000 | 1.000000 | 1.000000 | 0.000000 | 1.82 |
| 19 | S | 0.302637 | 2.496 | 1.603020 | 1.600070 | 1.610030 | 0.009960 | 0.77 |
| 20 | S | 0.000000 | 0.984 | 1.000000 | 1.000000 | 1.000000 | 0.000000 | 0.05 |

TABLE II (FIG. 6, Wafer)
EFL = 1.9776
OBJECT DISTANCE = 95.0000

| # | TYPE | CURVE | SEPN | 0.000589 INDEX1 | 0.000656 INDEX2 | 0.000486 INDEX3 | DISPN | CLR.RAD |
|---|---|---|---|---|---|---|---|---|
| 1 | S | −0.255466 | 0.000 | 1.000000 | 1.000000 | 1.000000 | 0.000000 | 2.50 |
| 2 | S | −0.202673 | 3.000 | 1.762000 | 1.756400 | 1.775290 | 0.018890 | 2.50 |
| 3 | S | −0.030389 | 12.999 | 1.000000 | 1.000000 | 1.000000 | 0.000000 | 2.50 |
| 4 | S | −0.068395 | 5.000 | 1.516730 | 1.514320 | 1.522380 | 0.008060 | 2.50 |
| 5 | S | −0.101326 | 3.000 | 1.846660 | 1.836510 | 1.872040 | 0.035530 | 2.50 |
| 6 | S | −0.179953 | 0.500 | 1.000000 | 1.000000 | 1.000000 | 0.000000 | 2.50 |
| 7 | S | 0.000000 | 6.000 | 1.516727 | 1.514322 | 1.522379 | 0.008057 | 2.50 |
| 8 | S | −0.033290 | 4.500 | 1.000000 | 1.000000 | 1.000000 | 0.000000 | 2.86 |
| 9 | S | 0.182086 | 0.750 | 1.696690 | 1.692970 | 1.705540 | 0.012570 | 2.86 |
| 10 | S | −0.151784 | 6.913 | 1.433840 | 1.432490 | 1.437040 | 0.004550 | 2.68 |
| 11 | S | −0.101923 | 1.058 | 1.613280 | 1.609240 | 1.623090 | 0.013850 | 2.89 |
| 12 | S | 0.041053 | 0.000 | 1.000000 | 1.000000 | 1.000000 | 0.000000 | 2.94 |
| 13 | S | −0.035106 | 2.917 | 1.433840 | 1.432490 | 1.437040 | 0.004550 | 3.00 |
| 14 | S | 0.085752 | 8.651 | 1.000000 | 1.000000 | 1.000000 | 0.000000 | 2.89 |
| 15 | S | −0.159994 | 4.786 | 1.433840 | 1.432490 | 1.437040 | 0.004550 | 2.56 |
| 16 | S | 0.143060 | 1.794 | 1.653970 | 1.649200 | 1.665710 | 0.016510 | 2.53 |
| 17 | S | −0.088853 | 4.314 | 1.620050 | 1.617170 | 1.626930 | 0.009760 | 2.51 |
| 18 | S | 0.174076 | 0.001 | 1.000000 | 1.000000 | 1.000000 | 0.000000 | 2.39 |
| 19 | S | 0.029637 | 2.303 | 1.497760 | 1.495520 | 1.502960 | 0.007440 | 1.93 |
| 20 | S | 0.374913 | 0.005 | 1.000000 | 1.000000 | 1.000000 | 0.000000 | 1.72 |
| 21 | S | 0.302637 | 2.496 | 1.603020 | 1.600070 | 1.610030 | 0.009960 | 0.71 |
| 22 | S | 0.000000 | 0.984 | 1.000000 | 1.000000 | 1.000000 | 0.000000 | 0.06 |
| 23 | S | 0.000000 | 0.031 | 1.000000 | 1.000000 | 1.000000 | 0.000000 | 0.04 |

ALTERNATIVE DESIGNS

INDUSTRIAL APPLICABILITY

This invention is applicable in arts such as data processing where it can be employed in the manufacture of chips for personal computers, minicomputers, large scale computers and other data processing equipment. In addition, this system and process will be applicable to industrial and consumer electronic devices employing LSI chips. Electronic products such as transportation and control systems incorporating data processing systems for continuous monitoring and like functions can use products made by use of this invention.

Whereas this invention is elucidated herein with respect to specific embodiments, it is not limited thereto. The teachings found above will manifest to those skilled in the art numerous possible modifications, changes and variations within the scope of the invention.

What is claimed is:

1. Apparatus for aligning a first object and a second object in conjugate planes of an imaging system, said first object having a first depolarizing alignment mark, said second object having a second depolarizing alignment mark, comprising a) a first object with a first alignment mark and a second object with a second alignment mark, said objects being in conjugate planes with said first alignment mark positioned at an oblique angle of rotation with respect to said second alignment mark, b) light beam means for illuminating said first and second alignment marks with a pair of polarized light beams directed along a common optical path towards said first and second alignment marks with said first and second light beams being polarized at an oblique angle angle with respect to each other, one of said light beams adapted for interacting with a depolarizing alignment mark on said first object and the other of said light beams being adapted for interacting with a depolarizing alignment mark on second object, c) depolarizing alignment marks on said first and second objects aligned to interact with said light beams by being at an angle of rotation appropriate for depolarizing the corresponding one of said light beams, d) means for receiving any reflections of said said light beams from said first and second alignment marks said reflections being directed along a common optical path and being separated optically by means for beam splitting into first and second output beams passed through polarization analyzing filters to produce polarized output beams, e) measuring the the light from each of the polarized output beams.

2. Apparatus in accordance with claim 1 wherein said oblique angles are about 45°.

3. Apparatus in accordance with claim 1 wherein shutter means are provided for blocking light from each of said first and second light beams selectively.

4. A method of aligning a first object and a second object in conjugate planes of an imaging system, said first object having a first alignment mark, said second object having a second alignment mark, comprising a) illuminating said first and second alignment marks with a pair of polarized light beams directed along a common optical path towards said first and second selectively depolarizing alignment marks, with the polarization direction of said first and second light beams being oriented at different angles and said first and second alignment marks being oriented at different angles for selectively depolarizing corresponding ones of said first and second beams, b) the reflections of said light beams from said first and second alignment marks being directed along a common optical path and being separated optically by means for beam splitting into first and second output beams passed through polarization filters to produce polarized output beams, c) measuring the the light from each of the polarized output beams.

5. A method in accordance with claim 1 wherein said different angles are about 45° apart.

6. A method in accordance with claim 3 wherein shuttering is employed for blocking light from each of said first and second light beams selectively.

* * * * *